United States Patent [19]

Katayama

[11] Patent Number: 5,047,831
[45] Date of Patent: Sep. 10, 1991

[54] REDUCED RESISTANCE CONTACT REGION FOR SEMICONDUCTOR DEVICE

[75] Inventor: Toshiharu Katayama, Hyogo, Japan
[73] Assignee: Mitsubishi Denki Kabushiki Kaisha, Tokyo, Japan
[21] Appl. No.: 444,358
[22] Filed: Dec. 1, 1989
[30] Foreign Application Priority Data Dec. 5, 1988 [JP] Japan .................. 63-308082

[51] Int. Cl.$^5$ .............. H01L 23/48; H01L 29/40; H01L 29/44; H01L 29/52
[52] U.S. Cl. ...................... 357/68; 357/65; 357/90; 357/91
[58] Field of Search ............ 357/91, 68, 65, 89, 357/90

[56] References Cited

U.S. PATENT DOCUMENTS

| 4,109,371 | 8/1978 | Shibata et al. | 29/571 |
| 4,785,344 | 11/1988 | Franz | 357/65 |
| 4,890,151 | 12/1989 | Kameda et al. | 357/65 |
| 4,903,112 | 2/1990 | Strack et al. | 357/55 |

FOREIGN PATENT DOCUMENTS 49-15377 4/1974 Japan .
35346 2/1987 Japan .

OTHER PUBLICATIONS

T. E. Seidel, "Ion Implantation", Chapter Six of VLSI Technology, edited by Sze, pp. 219-265.
IEEE Transactions on Electron Devices, article by Tsuji et al., entitled, "Submicrometer Optical Lithography Using a Double-Layer Resist by a Single Development Technology", vol. ED-31, No. 12, Dec. 1984.

Primary Examiner—Rolf Hille
Assistant Examiner—David Ostrowski
Attorney, Agent, or Firm—Lowe, Price, LeBlanc and Becker

[57] ABSTRACT

A semiconductor device comprising a contact region having reduced contact resistance is provided by the steps of implanting ions of impurities to a predetermined region of a main surface of a semiconductor substrate; forming an impurity diffusion region by applying heat treatment at 400° C.; etching the region from the surface of the semiconductor substrate to the maximum point of an ion concentration to form a metal wiring layer on the exposed surface of the thus formed impurity diffusion region. Since the impurity diffusion region is connected to the metal wiring layer at the maximum point of the ion concentration, the contact resistance can be a low value.

6 Claims, 4 Drawing Sheets

REDUCED RESISTANCE CONTACT REGION FOR SEMICONDUCTOR DEVICE

BACKGROUND OF THE INVENTION

1. Field of the Invention

The present invention relates generally to a contact region for semiconductor device and more particularly to a minimum contact resistance semiconductor device contact region. The present invention also relates to a method for manufacturing a semiconductor device comprising a contact region having reduced contact resistance.

2. Description of the Background Art

In the manufacture of a semiconductor integrated circuit, when a transistor or the like is formed on the surface of a semiconductor substrate, P type or N type impurities need be diffused in the semiconductor substrate.

Diffusion of impurities comprises the step of introducing impurities shallow to the surface of the semiconductor and the step of diffusing impurities deeply in the semiconductor. The former step done by a method of introducing impurities from the surface of the semiconductor by thermal diffusion or a method of implanting atoms of impurities to the semiconductor by ion implantation. In the thermal diffusion method, impurity gas having higher concentration is transmitted from a diffusion source to a heated wafer surface and impurities are diffused to the shallow portion of the surface in a short period of time to the solid solubility. It is difficult to accurately control the impurity concentration on the wafer surface in the thermal diffusion method, and this method is used only when impurities are to be diffused deeply to higher concentration.

Meanwhile, as described in "ION IMPLANTATION" by T. E. SEIDEL pp. 219 to 265, Chapter SIX of VLSI TECHNOLOGY edited by SZE, the ion implantation is a method of ionizing such as gas including impurities, selectively taking out the required ions of the ionized gas by mass spectrometry employing an electric field/magnetic field, accelerating the ions by the electric field to irradiate the semiconductor substrate, thereby implanting the impurities into the semiconductor substrate.

When boron are introduced by ion implantation to a $P^-$ or $N^-$ silicon substrate, a $P^+$ region is formed on the silicon substrate, and when phosphorous or arsenic ions are implanted, an $N^+$ region is formed. The concentration of impurities can be easily controlled in the ion implantation, and the distribution of impurity concentration can be well reproduced. Therefore, this method is widely used.

In addition, Japanese Patent Publication No. 49-15377 discloses the formation of an oxide film on an exposed surface of a semiconductor substrate during a thermal diffusion process after implantation in order to prevent contamination of the impurity region formed by ion implantation and to provide electrical contact at the region where the concentration of ions is the highest. FIGS. 1A and 1B are views of a semiconductor device showing an outline of its manufacturing steps used therein. Then, referring to FIGS. 1A and 1B, a description is made of manufacturing steps of a contact portion of a conventional semiconductor device.

Referring to FIG. 1A, an oxide film 20 is formed on a main surface of a semiconductor substrate, for example, n-type Si substrate 10. Photoetching is performed on this oxide film 20 to expose a predetermined portion of the semiconductor substrate 10. Then, ions of impurities 30 such as phosphorous or boron are implanted on the exposed surface of the semiconductor substrate 10 using a residue of an oxide film 20 as a mask. As a result, an ion implanted layer 40 is provided.

Referring to FIG. 1B, a heat treatment is performed at 900°-1300° C. in order to activate impurities introduced by the ion implantation and to recover from a lattice defect. The reason why the impurities are activated is that the region where the impurities are implanted does not exhibit the nature as the $N^+$ or $P^+$ region unless they are activated. The above described lattice defect is generated by collision of ions having high energy with Si crystals during ion implantation, which causes leak current and the like.

During this heat treatment, the semiconductor substrate 10 to which ions are implanted is heated to the temperature of 900° to 1300° C. in the $N^2$ gas atmosphere and exposed to $O_2$ gas for a predetermined time period. In this processing, the exposed surface of the semiconductor substrate 10 is oxidized to form an oxide film 50 and the impurity ions are thermally diffused to form an impurity diffusion region 60. In this processing, a predetermined temperature and hour conditions such as 800° C., 20 minutes are used to obtain a desired impurity concentration of the impurity diffusion region 60.

When the thus formed impurity diffusion region 60 is to be electrically connected to another active region or bonding pad and the like, the oxide film 50 is etched away and a metal wiring layer 70 is formed on the impurity diffusion region 60 as shown in FIG. 1C.

A multilayer interconnection structure is employed in order to improve the speed of operation of the circuit. A metal having high melting point has relatively large resistance, and therefore, a metal having lower melting point such as Al having lower resistance is used as the material for interconnection in the multilayer interconnection structure. However, the metal having low melting point, especially Al is melt during heat treatment at the temperature of 900° to 1300° C. Therefore, the above described manufacturing method can not be applied to a semiconductor device having the multilayer interconnection structure employing the metal having lower melting point such as Al.

The concentration distribution of the implanted ions in the state after implantation is shown by a solid line in FIG. 2. The ions entered the substrate lose their energy by the interaction with the atoms constituting the substrate to be in the static state, so that a distribution having a single peak such as shown in FIG. 2 is provided. The concentration distribution changes under the influence of ion diffusion by the heat treatment and the oxide film thickness formed on the other hand. After the thermal diffusion, infinite numbers of distribution profiles can be provided dependent on the manner of heat treatment. Two examples of concentration distribution are shown by dotted lines in FIG. 2. Although it is possible to provide a single peak distribution after the thermal diffusion, it is very difficult to set the temperature and atmosphere conditions to realize distribution with a single peak, since the surface of the semiconductor substrate is oxidized during thermal diffusion, as described above.

In addition, in order to perform the treatment under the condition found out, it is necessary to prepare a control apparatus capable of precisely controlling the temperature and atmosphere.

In addition, generally it is desired to reduce contact resistance between the impurity diffusion region 60 and the metal wiring 70 in the above described semiconductor device. Especially the above described contact resistance should be lower in the memory. In this case, the impurity diffusion region 60 needs to be connected to the metal wiring 70 at a maximum point of the concentration of the impurities. At this time, since it is easy to etch only the oxide film away, it is thought to bring the maximum point of the concentration to the interface between the oxide film 50 and the impurity diffusion region 60. However, since the maximum point of the concentration changes depend on the temperature and atmosphere conditions because of the above described reason, it is extremely difficult to correspond the above mentioned interface with the maximum point of the concentration.

SUMMARY OF THE INVENTION

An object of the present invention is to provide a method for manufacturing a semiconductor device having low contact resistance between an impurity diffusion region and a metal wiring layer thereon.

Another object of the present invention is to easily manufacture a semiconductor device using a low temperature process.

An additional object of the present invention is to provide a semiconductor device having a low contact region between impurity diffusion region and metal wiring layer thereon.

In the present invention, impurity ions are implanted in order to form an impurity region on a selectively exposed surface region of a semiconductor substrate. The impurity region has an impurity density profile which has a single peak value of the impurity concentration spaced apart from the surface of the semiconductor substrate by a predetermined distance. The impurity region is activated. In order to provide a contact region of the semiconductor substrate, the impurity region is etched to the distance corresponding to the peak value of the impurity density profile. A conductive layer electrically connected to the contact region and extending over the semiconductor substrate is formed.

According to the present invention, since the impurity region can come in contact with the conducting layer at the maximum position of an impurity concentration by etching the impurity region to the position of the maximum concentration of the impurity ions, it is possible to reduce the contact resistance between the impurity region and the conducting layer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 3A to 3D, a description is given of one embodiment of the present invention.

Figure 3A:
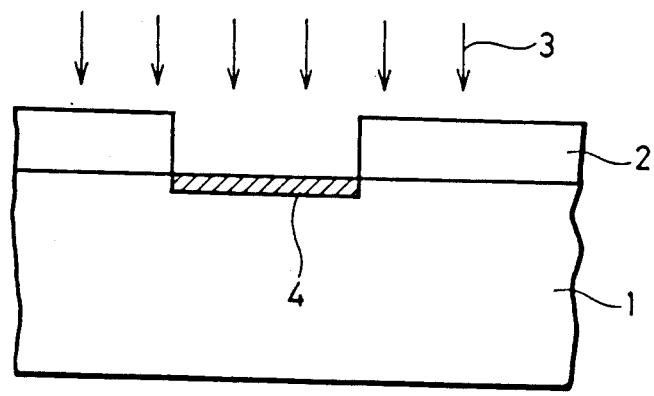
FIGS. 3A to 3D are sectional views of a semiconductor device for describing its manufacturing method in accordance with one embodiment of the present invention.

Referring to FIG. 3A, a silicon oxide film 2 is formed on a main surface of a semiconductor substrate, for example a p-type Si substrate 1. Photoetching is performed on this silicon oxide film 2 to expose a predetermined portion of the Si substrate 1. Then, ions of impurities 3 such as phosphorous or arsenic are implanted on the exposed surface of the Si substrate 1 using the residual silicon oxide film 2 as a mask, whereby an ion implanted layer 4 can be provided. When arsenic is implanted to the concentration of $10^{15}$ cm$^{-2}$ by using an accelerating device of 50KV, an ion implanted layer having the thickness of about 1000 Å is provided. Although implantation of N$^+$ ions to the P-type silicon substrate has been described, P$^+$ ions such as boron may be implanted to the p$^-$ substrate, P$^+$ ions may be implanted to an N type substrate, and N$^+$ ions such as arsenic or phosphorus may be introduced to an N$^-$ substrate.

Figure 1A:
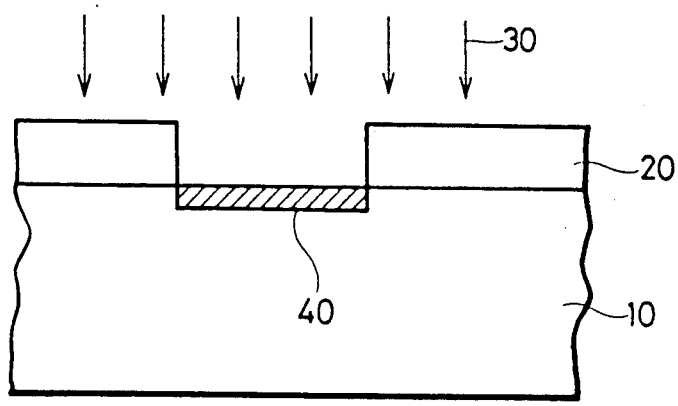
FIGS. 1A to 1C are schematic sectional views of a conventional semiconductor device showing its manufacturing steps.
Figure 1B:
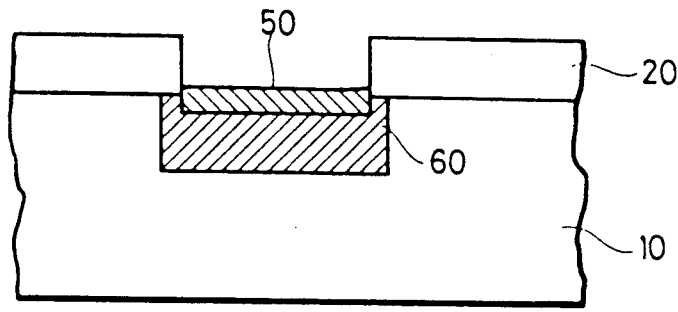
Figure 1C:
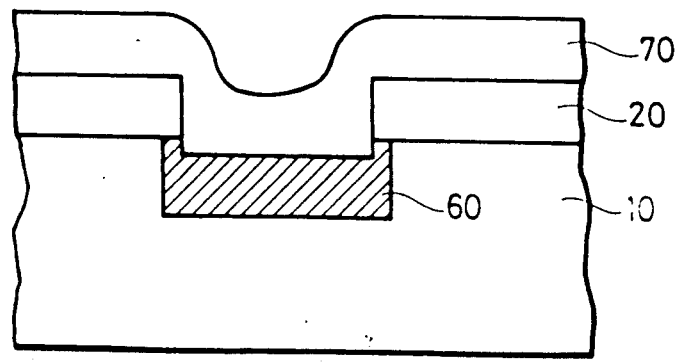
Figure 2:
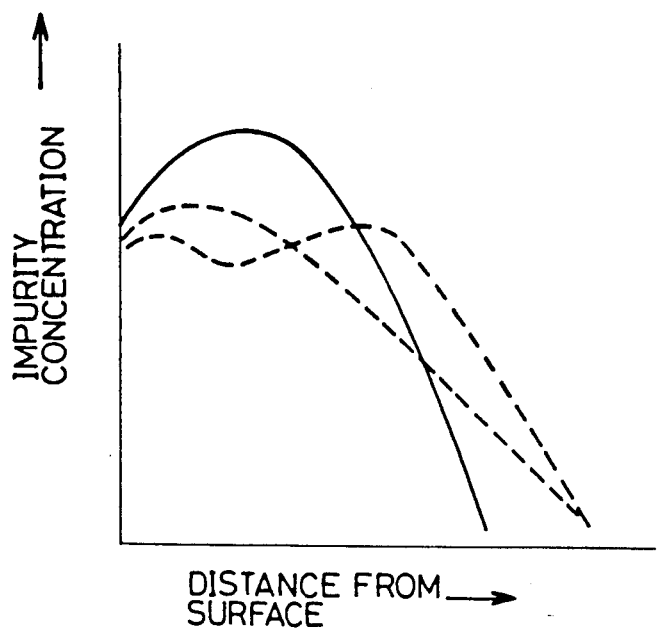
FIG. 2 is a graphic representation showing concentration distributions of impurities after ion implantation and thermal diffusion during the manufacturing steps of the conventional semiconductor device.
Figure 4:
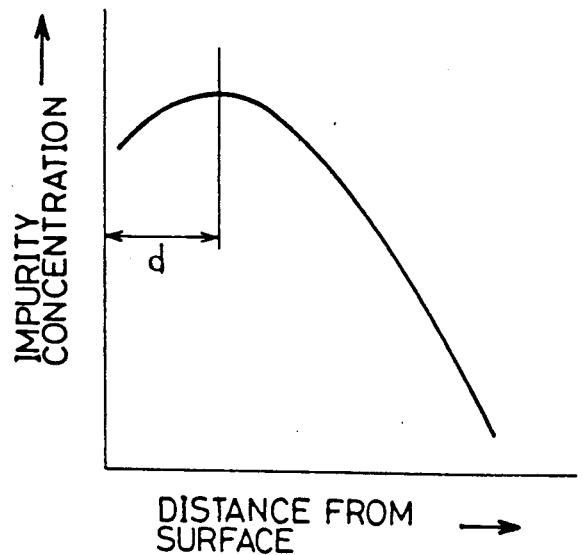
FIG. 4 is a graphic representation showing an impurity concentration distribution after activation in the manufacturing steps of the semiconductor device in accordance with one embodiment of the present invention.
Figure 3B:
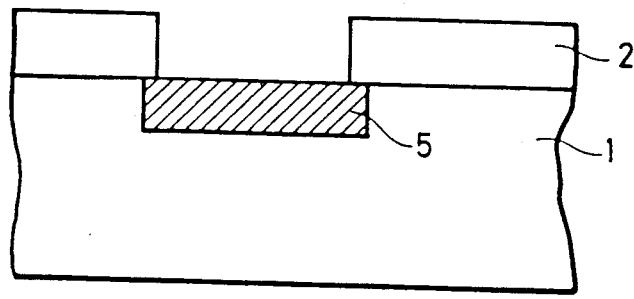

When Al is used as the material for the wiring, a heat treatment is performed at a temperature lower than 450° C. and preferably in the range of 350° C. to 450° C. in order to activate the implanted impurities and to recover a lattice defect. Referring to FIG. 3B, by carrying out heat treatment about 400° C. in nitride atmosphere for about 80 minutes, an impurity diffusion region 5 having a concentration distribution having a single sharp peak shown in FIG. 4 can be obtained. In FIG. 4, the maximum point of the impurity concentration exists in the position apart from the surface by a distance d.

Figure 3C:
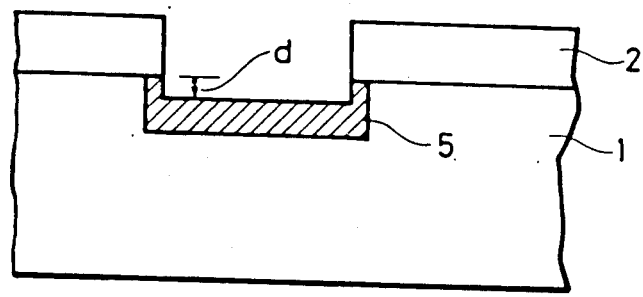

Referring to FIG. 3C, the portion from the surface to a depth of d of the Si substrate 1 is etched away by, for example, reactive ion etching. An etching speed is defined by an etching gas, a material to be etched and an etching condition. Therefore, if these conditions are determined a constant speed can be obtained, so that the end point of the etching can be determined only by an etching time.

Figure 3D:
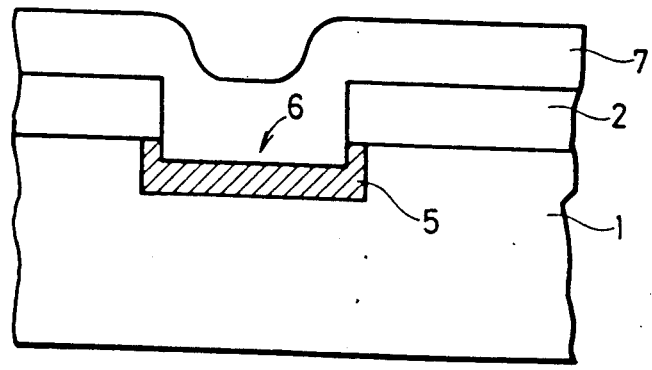

Referring to FIG. 3D, a metal wiring layer 7 such as aluminum and the like is formed on the thus formed recessed portion 6 by sputtering. Since the impurity diffusion layer 6 is connected to the metal wiring layer 7 at the maximum point of the impurity concentration, the contact resistance between them can be an extremely low value.

Figure 5:
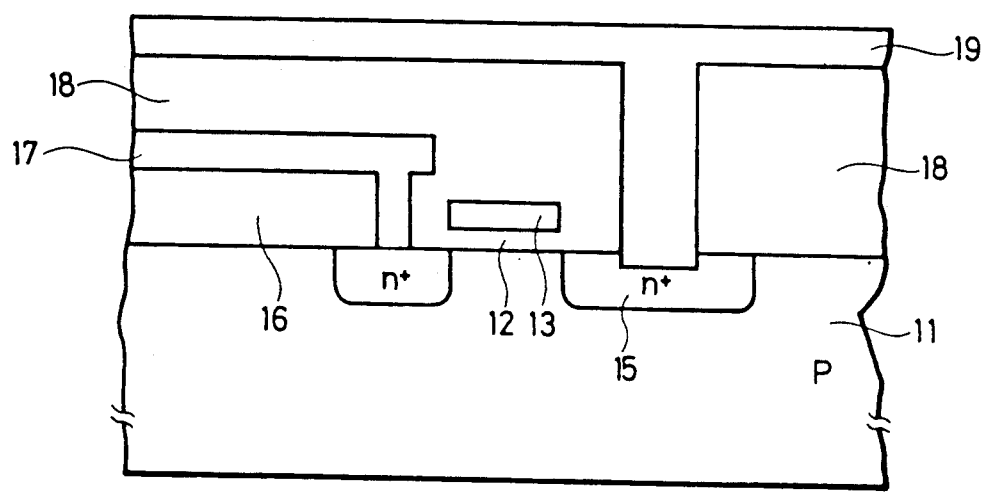
FIG. 5 is a cross sectional view showing a logic circuit in accordance with one embodiment of the present invention.

An example of a logic circuit manufactured by applying the above described manufacturing method is shown in FIG. 5. Referring to FIG. 5 a gate electrode 13 is formed on the semiconductor substrate 11 with a gate insulating film 12 posed therebetween. The surface of the semiconductor substrate 11 below the gate electrode 13 serves as a channel region. Impurity diffused layers 14 and 15 are formed sandwiching the channel region on the surface of the semiconductor substrate 11.

The impurity diffused layer 14 is connected to a first Al interconnection layer 17 extending on the insulating film 16 formed on the surface of the semiconductor substrate 11, while the impurity diffused layer 15 is connected to a second Al interconnection layer 19 extending on the interlayer insulating film 18 formed on the Al interconnection layer 17. The Al interconnection layer 19 and the impurity diffused layer 15 are electrically connected to each other at a point where the impurity concentration is at the highest.

Although a description was given of an example in which a contact portion was provided on a p-type Si substrate in the above-described embodiment, an n-type Si substrate may be used. In addition, various substrates can be applied other than the Si substrate if they can be implanted by ions. Furthermore, the etching of the impurity diffusion layer may be wet etching as well as dry etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a substrate having a major surface;
   an impurity region formed in the major surface of said substrate, an impurity concentration profile of said impurity region having a single peak impurity concentration value spaced a predetermined distance from the major surface of said substrate and decreasing monotonically therefrom as a function of distance from the major surface of said substrate;
   a recess formed in the major surface of said substrate to a depth corresponding to said peak impurity concentration value to provide a contact region of said substrate; and
   a conducting layer having a lower surface bound by end surfaces, said conducting layer being formed on said substrate and in contact with said contact region, the lower surface of said conducting layer coinciding with a region of said impurity region displaced from the major surface of said substrate and corresponding to said single peak inpurity concentration, opposite end surfaces of said conducting layer being formed at right angles to said lower surface.

2. The device of claim 1, wherein said substrate is formed of plural impurity regions spaced apart from each other on said substrate, plural contact regions formed respectively therein, and wherein plural conducting layers are in contact respectively with said contact regions, said plural contact regions formed respectively at different levels on said substrate.

3. A semiconductor logic circuit comprising:
   a substrate having a major surface;
   at least two high impurity regions formed in the major surface of said substrate, each said high impurity region having a single peak impurity value at a predetermined distance from said major surface of said substrate and decreasing monotonically therefrom as a function of distance from the major surface of said substrate;
   an insulating region covering said substrate and said high impurity regions;
   at least one gate electrode formed between two of said high impurity regions and separated from the major surface of said substrate by a portion of said insulating region;
   a first potential electrode formed over the major surface of said substrate and separated therefrom by a portion of said insulating region, said first potential electrode formed so that one part thereof contacts one of said high impurity regions;
   a second potential electrode formed over the major surface of said substrate and separated therefrom by a portion of said insulating region, said second potential electrode being formed so that one part thereof contacts a second one of said high impurity regions;
   at least one of said potential electrodes being formed at said predetermined depth in its respective high impurity region so as to be in contact with that part of its respective high impurity region having said single peak impurity concentration value, thereby forming a minimum resistance contact between at least one said potential electrode and its respective high impurity region.

4. The logic circuit of claim 3, wherein at least one of said impurity regions is formed to a depth of one thousand angstroms from the major surface of said substrate.

5. The semiconductor logic circuit of claim 3, wherein at least one of said high impurity regions is formed at a concentration of $10^{15}$ cm$^{-2}$.

6. The semiconductor logic circuit of claim 3, wherein said potential electrodes are formed of a metal having a melting range between 660° C. and 450° C.

* * * * *